United States Patent
Bernier et al.

(10) Patent No.: US 6,331,119 B1
(45) Date of Patent: Dec. 18, 2001

(54) CONDUCTIVE ADHESIVE HAVING A PALLADIUM MATRIX INTERFACE BETWEEN TWO METAL SURFACES

(75) Inventors: William E. Bernier, Endwell; Edward G. Bundga, Endicott, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/474,912

(22) Filed: Dec. 28, 1999

(51) Int. Cl.$^7$ ........................................ H01R 4/58
(52) U.S. Cl. .................. 439/91; 174/117 A; 428/626
(58) Field of Search .................. 439/91; 174/117 A; 77/257; 428/626; 252/514

(56) References Cited

U.S. PATENT DOCUMENTS

| | | | |
|---|---|---|---|
| 4,254,431 | 3/1981 | Babuka et al. ........................ | 357/82 |
| 5,019,944 | 5/1991 | Ishii et al. ............................. | 361/400 |
| 5,137,461 | 8/1992 | Bindra et al. ......................... | 439/74 |
| 5,163,834 | 11/1992 | Chapin et al. ........................ | 439/66 |
| 5,185,073 | 2/1993 | Bindra et al. ......................... | 205/104 |
| 5,371,327 | * 12/1994 | Fujinami et al. ..................... | 174/257 |
| 5,420,520 | 5/1995 | Anschel et al. ....................... | 324/754 |
| 5,428,190 | * 6/1995 | Stopperan ............................. | 174/261 |
| 5,431,571 | 7/1995 | Hanrahan et al. .................... | 439/91 |
| 5,808,874 | * 9/1998 | Smith ................................... | 361/769 |
| 5,813,870 | 9/1998 | Gaynes et al. ........................ | 439/91 |
| 5,910,641 | 6/1999 | Gaynes et al. ........................ | 174/52.4 |
| 5,977,642 | 11/1999 | Appelt et al. ......................... | 257/780 |
| 6,081,038 | * 6/2000 | Murayama ............................ | 257/783 |
| 6,087,021 | * 7/2000 | Gaynes et al. ........................ | 428/546 |
| 6,096,574 | * 8/2000 | Smith ................................... | 438/106 |

FOREIGN PATENT DOCUMENTS

| | | |
|---|---|---|
| 1121011 | 3/1982 | (CA) . |
| 2151683 | 10/1971 | (DE) . |

OTHER PUBLICATIONS

"Liquid Metal/Dendrite Connector", by R. Babuka et al, IBM Technical Disclosure Bulletin, vol. 22, No. 7, Dec., 1979.

"Dendrite Connectors for Low Temperature System Packaging" by F. A. Almquist, Research Disclosure, No. 309, Jan., 1990, Kenneth Mason Publications Ltd.

"Interposer for Direct Chip Attach or Surface Mount Array Devices", IBM Technical Disclosure Bulletin, vol. 36, No. 07, Jul., 1993.

"Solving the Interconnect Puzzle", IBM Cable and Connector Products, Technology Products (date unknown).

* cited by examiner

Primary Examiner—Khiem Nguyen
Assistant Examiner—Michael C. Zarroli
(74) Attorney, Agent, or Firm—William N. Hogg

(57) ABSTRACT

A method of forming an isotropic electrical connection and a mechanical bond between two articles having metal surfaces thereon and the resulting bond is provided. Preferably, the metal surfaces are the surfaces of metal contact pads on a dielectric substrate and on an electronic device such as an I/C chip or chip carrier. The mechanical bond and electrical connection is provided by utilizing a conductive adhesive, in which adhesive the conduction is provided by metal particles which have exposed palladium thereon. The particles may be the metal palladium itself or it may be some other metal, such as silver, having palladium coated thereon, preferably by electrodeposition. The particles typically are flakes with the palladium having an incipient dendritic form on the surface, i.e.; the palladium has a multi-pointed surface configuration that can grow into fully formed needle-like dendritic structures. However, the shape of the particle is not significant. The polymer preferably is conventional polyimide/siloxane which is well known in the art for use in formulating conductive adhesives. The polyimide/siloxane is a thermoplastic, i.e. upon heating it softens and upon cooling it sets, and upon reheating it will soften and reflow.

12 Claims, 1 Drawing Sheet

CONDUCTIVE ADHESIVE HAVING A PALLADIUM MATRIX INTERFACE BETWEEN TWO METAL SURFACES

BACKGROUND OF THE INVENTION

Field of the Invention

This invention relates generally to isotropic electrically conductive bonding between two metal surfaces, and more particularly, to a method and structure of forming a palladium matrix in situ within adhesive material to provide mechanical bonding and electrical connection between two metal surfaces.

BACKGROUND OF THE INVENTION

Description of the Prior Art

Conductive adhesives are often used to mechanically bond two articles together while providing electrical conductivity between metal surfaces on the faces of the articles. These conductive adhesives may be selected from various types of thermoplastic material, one of the materials being a polyimide/siloxane. In order to achieve the high conductivity often required, a very high loading of the metal particles within the adhesive is required. Typically, these particles are silver particles or, in some cases, tin coated copper may be used. Moreover, after the bond is formed, underfill material is provided around the joints which tends to degrade the electrical interconnection of the particles to the metal surface to some extent. In addition, contact resistance often in the form of an oxide film on the metal surface can commonly occur at the interface where the conductive adhesive comes into contact with the metal surface of the item being joined. Also, the polymer or the oxidation of the metal surface itself may cause an insulative layer to be formed at the interface between the metal particles and the metal surface immediately or after latency.

In the case of tin coated copper particles in the adhesive the materiel must be heated hot enough to reflow the tin to form the internal joints in the polymer which makes this particular type of conductive adhesive undesirable for many applications. Also, in the case of silver particles, attempts at rebonding or rework of the bond in case such is required often results in poor electrical interconnections, necessitating the complete removal of the adhesive and forming a new bond

SUMMARY OF THE INVENTION

A method of providing an isotropic electrically conductive structurally strong adhesive bond between two metal surfaces and the resulting structure is provided. The method includes the provision of an adhesive with conductive particles dispersed therein, which particles have exposed palladium thereon. The particles can either be palladium metal itself or can be another metal, preferably silver particles, plated with palladium. The adhesive with the dispersed particles therein is interposed between two metal surfaces which are to be mechanically bonded and electrically connected, and the palladium is grown in situ to form a continuous metal matrix from the particles and the metal surfaces, the palladium forming a dendritic or dendrite structure which penetrates the metal surfaces. Preferably, the in situ growing is done at elevated temperatures between about 200° C. to about 240° C. and, preferably around 220° C., and at a pressure of from about 17 to about 51 Kg/in.sq. and, more preferably, from about 28 to about 40 Kg/in.sq. The resulting structure is characterized in that the palladium from the various particles interdiffuses with itself as well as penetrating and/or diffusing into the metal surfaces to be joined, and when the palladium is coated onto another metal, there is interdiffusion between the other metal of the particle and the palladium so that an essentially unitary structure or metal matrix within the polymer is provided rather than as in conventional prior art wherein there are mechanical interfaces without metallurgical diffusion or significant mechanical penetration.

DESCRIPTION OF A PREFERRED EMBODIMENT(S)

According to the present invention, a method of forming an isotropic electrical connection and a mechanical bond between two articles having metal surfaces thereon and the resulting bond is provided. Preferably, the metal surfaces are the surfaces of metal contact pads on a dielectric substrate and on an electronic device such as an I/C chip or chip carrier. The mechanical bond and electrical connection is provided by utilizing a conductive adhesive, in which adhesive the conduction is provided by metal particles which have exposed palladium thereon. The particles may be the metal palladium itself or it may be some other metal, such as silver, having palladium coated thereon, preferably by electrodeposition. The particles typically are flakes with the palladium having an incipient dendritic form on the surface, i.e., the palladium has a multi-pointed surface configuration that can grow into fully formed needle-like dendritic structures. However, the shape of the particle is not significant. The polymer preferably is conventional polyimide/siloxane which is well known in the art for use in formulating conductive adhesives. The polyimide/siloxane is a thermoplastic, i.e. upon heating it softens and upon cooling it sets, and upon reheating it will soften and reflow.

Figure 1:
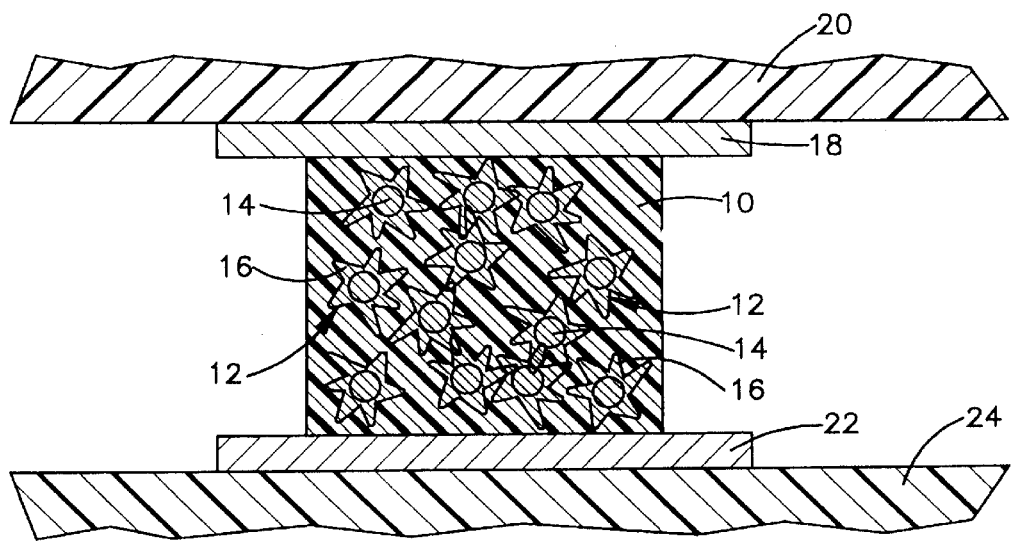
FIG. 1 is a longitudinal sectional view somewhat diagrammatic of an adhesive with Palladium coated silver particles dispersed therein and disposed between two metal surfaces prior to compression of the adhesive and dendritic growth of the palladium.
Figure 2:
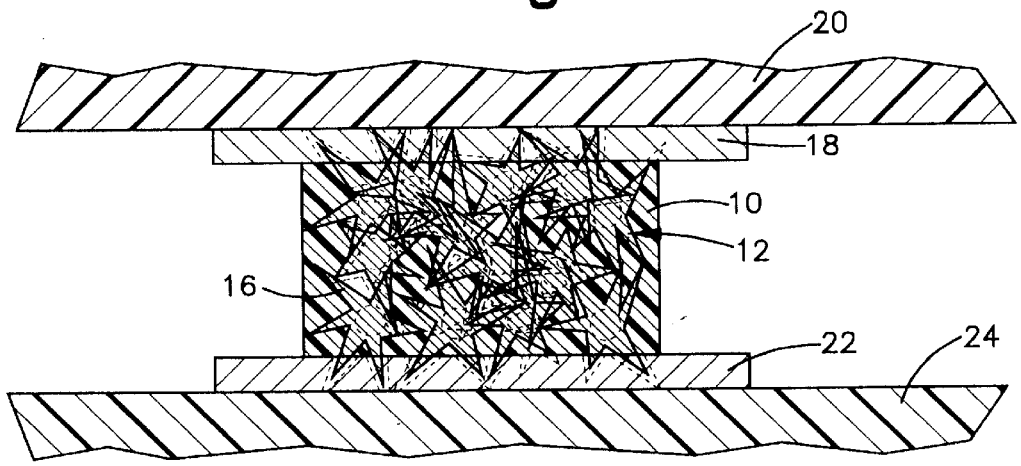
FIG. 2 is view similar to FIG. 1 after compression of the adhesive and dendritic growth of the palladium according, to this invention.

As shown in FIG. 1 an adhesive polymer 10 with the particles 12 therein which particles preferably are comprised of a silver core 14 having palladium 16 coated, preferably by electrodeposition, is interposed between contact pads, one of which is shown at 18 on an I/C chip 20, and one of which is shown at 22 on a dielectric substrate, such as a chip carrier 24. As can be seen in FIG. 1, in the as-applied condition the palladium 16 tends to form an irregular needle-like surface structure having somewhat of an incipient dendritic form. This is a natural result of the electrodeposition process for coating the palladium 16 onto the silver core 14. The palladium coatings 16 on the particles 12 are in some limited physical contact with each other and with the pads 18 and 22. However the contacts are not sufficient to form a good electrical contact and mechanical bonding As seen in FIG. 2, the palladium is grown to form a continuous metal matrix of the particles 12 and the pads 18 and 22 to form an acceptable electrical connection and a strong mechanical/metallurgical bond. This is preferably done under heat and pressure, the heat preferably being from about 200° C. to about 240° C. and preferably about 220° C., and the pressure being from about 17 to about 51 Kg/sq.in. and preferably from about 28 to about 40 Kg/sq.in. This will result in the diffusion of the palladium into the metal surfaces which it contacts, i.e the diffusion of palladium coating 14 on one particle 12 into the palladium coatings 14 on other particles 12, which it is contacting, and into the silver core 14 on which it is coated, and into the pads 18 and 22. This forms an essentially continuous interdiffusion network. Moreover, the palladium tends to form very pronounced well defined dendrites as opposed to the incipient dendritic structure in the as coated form shown in FIG., 1 when heated, and under pressure, and will physically penetrate into the metal pads 18 and 22 as well as diffuse therein. This diffusion and penetration into the metal pads provides two significant benefits over the prior art conductive adhesive formulations. One benefit is the growth of the palladium as dendrites will penetrate through any surface oxide on the metal contact pads 20 and 22, thus insuring good electrical contact, even if there is a surface oxide thereon, and it will tend to form a stronger physical bond than with just the adhesive Also, the palladium tends to form a relatively continuous isotropic electrically conductive structure with a significantly increased electrical path over the prior art where the electrical path is merely through contacting surfaces of the conductive particles. Also, the conductive path is enhanced by the interdiffusion, which reduces or eliminates any of the polymer becoming trapped between particles and thus acting as an electrical insulator between adjacent particles.

The maximum temperature to which the applied adhesive should be heated to form the dendritic structure is dictated by the temperature to which the adhesive can be heated without degradation of the polymer, which in the case of polyimide/siloxane is about 240° C. To promote relative rapid dendrite the temperature should be at least about 200° C., although lower temperatures can be used and the time extended at which the temperature is held. Generally the time should be from about 10 seconds to about 68 seconds depending on the temperature. Shorter times may result in incomplete dendrite formation, and longer times generally do not add to the beneficial result. The pressure should be at least about 17 Kg/sq.in. to ensure good electrical results, and pressures greater than about 51 Kg/sq.in. tend to bring the chip 20 and substrate 24 too close together for the effective use of underfill material as will be described presently. The table below shows the tested range of parameters tested and the preferred range.

TABLE

| Parameter | Tested Range | Preferred Range |
| --- | --- | --- |
| Bond Force Range (1) | 300–900 grams | 500–700 grams |
| Bond Dwell Range (2) | 10–68 seconds | 40–60 seconds |
| Bond Temperature Range (3) | 250–320° C. | 295–315° C. |
| Bond Line Range (4) | 0.0021–0.0031" | 0.0027–0.0031" |
| Bond Pull Force Range (5) | 0.7–26.7 lbs. | >10 lbs. |

(1) Total force applied between 224 contact pads, each having a diameter of 10 miles on each of two substrates
(2) Time at temperature
(3) Temperature as measured at the bonder heating element which is not necessarily the temperature in the adhesive.
(4) Separation of substrates after bonding. This is important in order to allow underfill material to flow into and mechanically stabilize the bonded joints to mechanical stress. Minimum underfill bond line or separation is typically about 2.5 mils; however, under some conditions, a separation as low as 2.0 miles is adequate.
(5) Force required to separate the two substrates after cooling to ambient temperature from the elevated temperatures. This is a bond test which would not be used in production, but it provides experimental data on the effectiveness of the bonding process.

(1) Total force applied between 224 contact pads, each having a diameter of 10 miles on each of two substrates
(2) Time at temperature
(3) Temperature as measured at the bonder heating element which is not necessarily the temperature in the adhesive.
(4) Separation of substrates after bonding. This is important in order to allow underfill material to flow into and mechanically stabilize the bonded joints to mechanical stress. Minimum underfill bond line or separation is typically about 2.5 mils, however, under some conditions, a separation as low as 2.0 miles is adequate.
(5) Force required to separate the two substrates after cooling to ambient temperature from the elevated temperatures. This is a bond test which would not be used in production, but it provides experimental data on the effectiveness of the bonding process.

Figure 3:
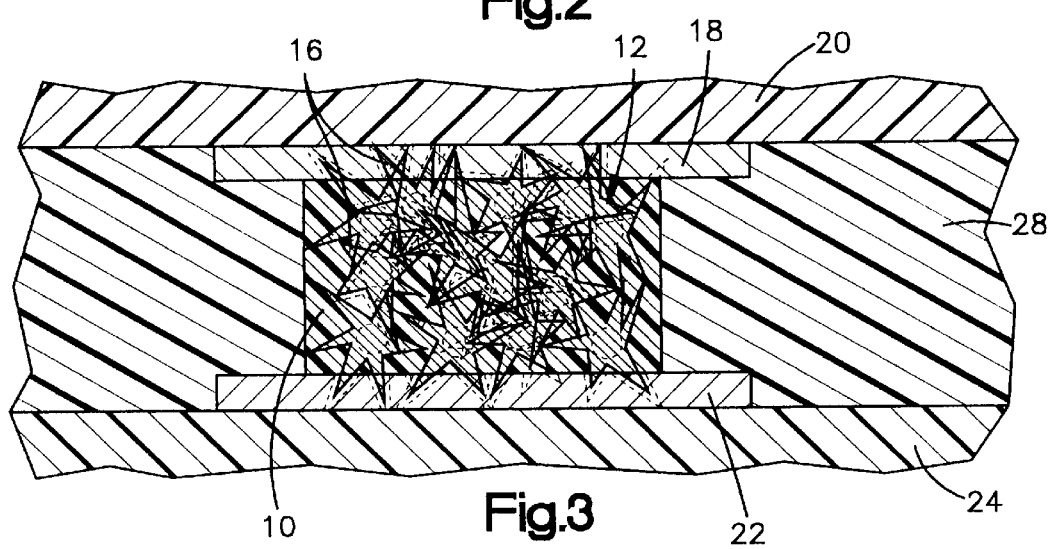
FIG. 3 is a view similar to FIG. 2 with underfill material added.

Typically, and as shown in FIG. 3 a fill or underfill dielectric composition 28 is injected between the substrate 24 and the I/C chip 20. This may be a silicone, epoxy, or other material which acts as an encapsulant around the bonds to protect the bonds from ambient atmosphere and mechanical damage. Since the palladium forms a unitary matrix with other particles 10 and with the pads 18, 22, the encapsulant 28 does not interfere with the electrical contact between the particles 12, or with the particles 12 and pads 18 and 22, and thus does not degrade the electrical properties as it may with the prior art conductive adhesives. Another benefit of the present invention is the reduction or elimination of the contact resistance shift of the metal contacts with the contact pads of about 10 to about 30 miliohms which can occur with connections made with conductive adhesive according to the prior art when the underfill 28 is applied.

Thus, with the present invention, a substantially continuous matrix of interdiffused metal forms a conductive path between the metal surfaces of two contact pads on adjacent articles with no degradation of properties when a fill composition is employed.

The invention has been described using particles having a silver core coated with palladium. However it is to be understood that particles of palladium metal could also used either alone or in conjunction with other particles such as palladium coated on silver or on another metal, or particles of just silver or another metal.

While the invention has been described in conjunction with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. An isotropic electrically conductive adhesive bonding two metal surfaces together comprising:
   a. an adhesive interposed between two metal surfaces; and
   b. a continuous metal matrix of interconnected dendritic particles having at least a palladium surface surrounded by said adhesive with said dielectric palladium particles penetrating adjacent particles and forming a structure which penetrates the metal surfaces.

2. The invention as defined in claim 1 wherein said adhesive is a thermoplastic.

3. The invention as defined in claim 1 further characterized by said palladium particles being palladium coated on a second metal.

4. The invention as defined in claim 3 wherein said second metal is silver.

5. The invention as defined in claim 2 wherein the adhesive is a polyimide/siloxane.

6. The invention as defined in claim 1 wherein said two metal surfaces are bond pads on first and second substrates.

7. The invention as defined in claim 6 wherein said first and second substrates are separated by at least 2.0 mils.

8. The invention as defined in claim 1 wherein the palladium of said particles are interdiffused with the two metal surfaces between which the particles are interposed.

9. The invention as defined in claim 1 wherein the palladium metals of the particles are interdiffused with each other.

10. The invention as defined in claim 1 wherein the palladium metals of the particles are interdiffused with each other and with the two metal surfaces.

11. The invention as defined in claim 1 wherein:

a. an adhesive interposed between two metal surfaces;

b. a continuous metal matrix of palladium surrounded by said adhesive with said palladium forming a dendrite structure which penetrates the metal surfaces;

c. and a dielectric material encapsulating the bond.

12. The invention as defined in claim 11, an isotropic electrically conductive adhesive bonding two metal surfaces spaced at least 2.5 mils apart together comprising:

a. an adhesive interposed between two metal surfaces; and b. a continuous metal matrix of palladium surrounded by said adhesive with said palladium forming a dendrite structure which penetrates the metal surfaces.

* * * * *

UNITED STATES PATENT AND TRADEMARK OFFICE
CERTIFICATE OF CORRECTION

PATENT NO. : 6,331,119 B1
DATED : December 18, 2001
INVENTOR(S) : William E. Bernier and Edward G. Bundga It is certified that error appears in the above-identified patent and that said Letters Patent is hereby corrected as shown below:

Column 6,
Lines 8-24, delete claims 11 and 12 in their entirety and insert therefor the following claims:
-- Claim 11. The invention as defined in claim 1, further characterized by a dielectric material encapsulating the bond.
  Claim 12. The invention as defined in claim 11 wherein the two metal surfaces are spaced at least 2.5 mils apart. --

Signed and Sealed this

Seventeenth Day of December, 2002

JAMES E. ROGAN
*Director of the United States Patent and Trademark Office*